United States Patent
Brick et al.

(10) Patent No.: US 7,522,646 B2
(45) Date of Patent: Apr. 21, 2009

(54) VERTICALLY EMITTING OPTICALLY PUMPED DIODE LASER WITH EXTERNAL RESONATOR

(75) Inventors: Peter Brick, Regensburg (DE); Stephan Lutgen, Regensburg (DE); Norbert Linder, Wenzenbach (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 63 days.

(21) Appl. No.: 10/745,378

(22) Filed: Dec. 22, 2003

(65) Prior Publication Data

US 2004/0190582 A1 Sep. 30, 2004

(30) Foreign Application Priority Data

Dec. 20, 2002 (DE) ................. 102 60 183

(51) Int. Cl.
*H01S 5/00* (2006.01)
(52) U.S. Cl. ............... 372/45.01; 372/43.01
(58) Field of Classification Search ......... 372/70, 372/75, 50.1, 97, 93, 21, 45.01, 43.01
See application file for complete search history.

(56) References Cited

U.S. PATENT DOCUMENTS

| | | | |
|---|---|---|---|
| 5,991,318 A | | 11/1999 | Caprara et al. |
| 6,327,293 B1 * | | 12/2001 | Salokatve et al. ............ 372/96 |
| 6,693,941 B1 * | | 2/2004 | Okazaki et al. ............. 372/75 |
| 6,859,481 B2 * | | 2/2005 | Zheng ..................... 372/70 |
| 2001/0012307 A1 | | 8/2001 | Hayakawa |
| 2001/0043636 A1 | | 11/2001 | Bewley et al. |

(Continued)

FOREIGN PATENT DOCUMENTS

GB 2 369 929 6/2002

(Continued)

OTHER PUBLICATIONS

Raja, M.Y. a. et al., "Resonant Periodic Gian Surface-Emitting Semiconductor Lasers", IEEE Journal of Quantum Electronics, vol. 25, No. 6, pp. 1500-1512, 1989.

(Continued)

*Primary Examiner*—Minsun Harvey
*Assistant Examiner*—Tuan N. Nguyen
(74) *Attorney, Agent, or Firm*—Cohen Pontani Liberman & Pavane LLP

(57) ABSTRACT

A vertically emitting semiconductor laser with an external resonator, a semiconductor body (1) in which a quantum well structure (4) is located as active zone that includes quantum wells (6) and barrier layers (5) situated therebetween, and at least one pumping radiation source (9) for irradiating into the active zone at an incidence angle $\alpha_p$ pumping radiation (10) of wavelength $\lambda_p$. The wavelength $\lambda_p$ and the incidence angle $\alpha_p$ of the pumping radiation are selected in such a way that the absorption of the pumping radiation takes place substantially inside the quantum wells. This avoids the losses during the capture of charge carriers from the barrier layers into the quantum wells that occur in the case of optically pumped semiconductor lasers where the pumping radiation is absorbed in the barrier layers. Also specified are advantageous refinements of the semiconductor body and combinations for incidence angle and wavelength of the pumping radiation source that permit a particularly effective optical pumping process of the quantum wells.

18 Claims, 7 Drawing Sheets

U.S. PATENT DOCUMENTS

| | | | |
|---|---|---|---|
| 2002/0071463 | A1 | 6/2002 | Garnache et al. |
| 2003/0012247 | A1* | 1/2003 | Chilla .................. 372/93 |
| 2004/0013154 | A1* | 1/2004 | Zheng .................. 372/96 |

FOREIGN PATENT DOCUMENTS

| | | |
|---|---|---|
| WO | WO 00/10234 | 2/2000 |
| WO | WO 00/25398 | 5/2000 |

OTHER PUBLICATIONS

Corzine, S. W., et al., "Design of Fabry-Perot Surface-Emitting Lasers with Periodic Gian Structure", IEEE Journal of Quantum Electronics, vol. 25, No. 6, pp. 1513-1523, 1989.

Garnache, A., et al., "Diode-pumped broadband vertical-external-cavity surface-emitting semiconductor laser applied to high-sensitivity intracavity absorption spectroscopy", JOSA B, vol. 17 (9), p. 1589, 1999.

Garnache, A., et al., "High sensitivity intracavity laser absorption spectroscopy with vertical-external-cavity surface-emitting semiconductor lasers", Optic Letters, vol. 24, (12) (1999), p. 826.

Garnache A. et al., "Sub-500-fs soliton-like pulse in a passively mode-locked broadband surface-emitting laser with 100 mW average power", Applied Physics Letters; vol. 80 (21), p. 3892 (2002).

Holm, M.A., et al., "High-Power diode-pumped AlGaAs surface-emitting laser", Applied Optics, vol. 38 (27) (1999), p. 5781.

Hoogland S. et al., "Passivity Mode-Locked Diode-Pumped Surface-Emitting Semiconductor Laser", IEEE Photonics Technology Letters, vol. 12 (9) (2000), p. 1135.

Kuznetsov M. et al., "High-Power (>0.5-WCW) Diode-Pumped Vertical-External-Cavity Surface-Emitting Semiconductor Lasers with Circular TEMoo Beams", IEEE Photonics Technology Letters, vol. 9 (8) (1997), p. 1063.

Alford W. J., et al., "High power and good beam quality at 980 nm from a vertical external-cavity surface-emitting laser", J. Opt. Soc. Am. B, vol. 19 (4) (2002), p. 663.

Muller M.I, et al., "Optically Pumped Semiconductor Thin-Disk Laser with External Cavity Operating at 660 nm", Proceedings of SPIE, vol. 4649 (2002), p. 265-271.

Holm M.A., et al., "Actively Stabilized Single-Frequency Vertical-External-Cavity AlGaAs Laser", IEEE Photonics Technology Letters, vol., 11 (12), (1999), p. 1551.

Raymond T.D., et al., "Intracavity frequency doubling of a diode-pumped external-cavity surface emitting semiconductor laser", Optics Letters, vol. 24 (16) (1999), p. 1127.

Sandusky J.V., et al., "A CW External-Cavity Surface-Emitting Laser", IEEE Photonics Technology Letters, vol. 8 (3) (1996), p. 313.

Kuznetsov M. et al, "Design and Characteristics of High-Power (>0.5-W CW) Diode-Pumped Vertical-External-Cavity Surface-Emitting Semiconductor Lasers with Circular TEMoo Beams", IEEE Journal of Selected Topics in Quantum Electronics; vol. 5 (3) (1999), p. 561.

* cited by examiner

VERTICALLY EMITTING OPTICALLY PUMPED DIODE LASER WITH EXTERNAL RESONATOR

This patent application claims the priority of the German patent application 10260183.6-33, the disclosed content of which is hereby incorporated by reference.

FIELD OF THE INVENTION

The invention relates to a vertically emitting, optically pumped semiconductor laser with an external resonator.

BACKGROUND OF THE INVENTION

Vertically emitting semiconductor lasers with an external resonator, which are also known as disk lasers or under the designation of VECSEL (Vertical External Cavity Surface Emitting Laser), constitute a new concept for lasers of high power at the same time as high beam quality. Such semiconductor lasers are described, for example, in U.S. Pat. No. 6,327,293, WO 00/25398 and U.S. Pat. No. 5,991,318.

A VECSEL includes a semiconductor body that includes as essential elements a reflector and a quantum well structure as active zone. The term semiconductor body is to be understood here and in the following discussion in such a way that this element consists substantially of semiconductor layers, but this does not exclude the possibility that it can, in particular, also include on its surface dielectric or metallic layers that preferably serve for increasing or decreasing the reflectivity of the surface. The reflector is preferably an epitaxially produced DBR (Distributed Bragg Reflection) mirror on which a quantum well structure is located. This quantum well structure includes periodically arranged quantum wells or groups of quantum wells with barrier layers situated therebetween. A VECSEL also includes an external mirror that forms a resonator with the reflector of the semiconductor body.

A characteristic of the VECSEL is the optical pumping process by a light source outside the semiconductor body, for example by a diode laser. In previously known publications, the absorption of the pumping radiation is desirable to take place in the barrier layers situated between the quantum wells. The absorption of the pumping radiation generates in the barrier layers charge carriers that relax into the quantum wells.

A disadvantage of this type of pumping process is that it is greatly affected by losses. Firstly, not all of the charge carriers released by the pumping radiation will enter the quantum wells, that is to say the entry efficiency is less than 1. A further loss mechanism is the relaxation of charge carriers from excited states lying relatively higher in terms of energy into energetically lower-lying levels of the quantum well. This energy loss, denoted as quantum defect, from higher-energy pump wavelength to the laser wavelength is expressed in the generation of heat that is output to the crystal lattice and thereby heats up the component. The maximum output power is therefore limited by the maximum permissible thermal loading.

A further disadvantage of known VECSEL designs is also that the pumping radiation passes only once through the active zone. Consequently, the absorption per quantum well is low, and so efficient operation of the VECSEL is possible only in structures with a high number of quantum wells. This results in disadvantages such as, for example, absorption losses owing to the large number of layers, boundary surfaces, high pump thresholds, low efficiency and an inhomogeneous pumping of the quantum wells.

SUMMARY OF THE INVENTION

One object of the invention is to provide a laser that has a more efficient pumping mechanism with smaller losses.

This and other objects are attained in accordance with one aspect of the invention directed to a vertically emitting semiconductor laser with an external resonator, and a semiconductor body in which a quantum well structure is located as active zone that includes quantum wells and barrier layers situated therebetween, and at least one pumping radiation source for irradiating into the active zone at an incidence angle $\alpha_p$ pumping radiation of wavelength $\lambda_p$. According to the invention, the wavelength $\lambda_p$ and the incidence angle $\alpha_p$ of the pumping radiation are selected in such a way that the absorption of the pumping radiation takes place substantially inside the quantum wells.

A suitable combination of wavelength and incidence angle is found, for example, by calculating the absorption spectrum of the semiconductor body, which includes the quantum well structure, for different incidence angles, taking account of multiple reflection and interference. Depending on the parameters of the semiconductor body, in particular the periodicity, the thickness and the composition of the layers, the absorption spectrum has, at specific incidence angles, one or more absorption lines of the quantum wells that are situated at longer wavelengths than the absorption edge of the barrier layers. It is preferred to select that incidence angle at which the absorption lines emerge most strongly, and the wavelength of the strongest of these lines. The absorption of the pumping radiation thereby takes place substantially in the quantum wells. The losses that occur in the case of the known pumping process of the barrier layers upon entry of the charge carriers into the quantum wells from the barrier layers are avoided by this optical pumping of the quantum wells.

The semiconductor laser according to the invention preferably includes a rear reflector on the side of the quantum well structure that is averted from the pumping radiation source, which reflector reflects the light of the pumping radiation source. Multiple passage of the pumping radiation through the active layer is thereby achieved, as a result of which the absorption of the pumping radiation is improved in terms both of its efficiency and of its homogeneity.

For example, the reflector for the pumping radiation from a layer or layer sequence made from metallic layers that contain, for example, chromium, platinum or gold, can comprise dielectric layers or epitaxially grown semiconductor layers.

In particular, the rear reflector can be a reflector whose bandwidth is sufficiently large that it reflects both the laser light and the light of the pumping radiation source, for example it can be a Bragg reflector. This is possible particularly in the case of the optical pumping, according to the invention, of the quantum wells, since in this method the difference between the laser wavelength and the wavelength of the pumping radiation is reduced by comparison with known pumping methods, in which the absorption takes place inside the barrier layers.

In a preferred embodiment the semiconductor body includes two reflectors arranged one above another, of which one serves to reflect the laser wavelength, and the other to reflect the pumping radiation.

An intermediate layer is preferably inserted between the reflector for the pumping radiation and the active zone. In the embodiment with two different reflectors for the reflection of the pumping radiation and the laser radiation, an intermediate layer can also be located between the two reflectors.

The standing wave field of the pumping radiation is varied by the selection of the composition and thickness of the intermediate layer or the intermediate layers. Since the absorption of the pumping radiation at the positions of the antinodes of the electric field is amplified, it is therefore possible to influence the absorption of the pumping radiation spatially. In particular, it is possible in combination with a suitable combination of wavelength and incidence angle of the pumping radiation to ensure that the antinodes of the electric field coincide with the positions of the quantum wells in the active zone such that the absorption in the quantum wells is amplified.

Advantageous developments of the invention are possible by applying additional layers to the side of the semiconductor body facing the pumping radiation source, in particular by means of layers that effect decreasing or increasing the reflectivity of the surface.

By applying a layer sequence that increases reflection, in particular a combination of one or more dielectric layers, metallic layers or epitaxially grown semi-conductor layers, it is possible to ensure that the reflection is amplified for pumping radiation incident from the inner side of the semiconductor body. Multiple passage of the pumping light through the active zone is thereby achieved in combination with the rear reflector.

In a preferred embodiment of the invention the applied layer sequence effects a coating of the surface for the laser wavelength. This is particularly appropriate when a resonator formed by the surface of the layer system and the external mirror leads to instability of the laser.

In a particularly preferred embodiment of the invention, the layer sequence has different reflection factors for the pumping radiation and the laser radiation. This can be achieved by a suitable selection of the layer thicknesses and compositions of additionally applied layers. For the laser light, applying a coating is appropriate for stabilizing the resonator. For the pumping radiation, the semiconductor body should have a low reflectivity for pumping radiation incident from outside, so that the pumping radiation from outside can be effectively coupled into the semiconductor body. On the other hand, multiple reflection of the pumping radiation inside the semiconductor body should be effected by the upper layer sequence, in order to achieve strong absorption in the quantum wells.

The wavelength and the incidence angle of the pumping radiation are preferably set such that a standing wave occurs inside the semiconductor body, in the case of which the quantum wells lie at the antinodes of the electric field of the pumping radiation, in order to achieve resonant absorption in the quantum wells.

A preferred variant of the invention utilizes a resonator that is formed from the reflector for the pumping radiation and the surface of the semiconductor body, which reflects at least partially. The difference in refractive index between the uppermost layer of the semiconductor body and the surrounding air already provides that the surface reflects partially. It is particularly advantageous when the pumping radiation satisfies the resonance condition of a longitudinal mode of the resonator that is formed from the reflector for the pumping radiation source and the preferably partially reflecting surface of the semiconductor body, since in this case the absorption in the quantum wells is resonantly amplified. A suitable combination of incidence angle and wavelength is to be found in order to satisfy the resonance condition for the pumping radiation. It is also possible in this case for the intermediate layer that is preferably present between the reflector for the pumping radiation and the quantum well structure to be varied in terms of its thickness and composition such that the resonance condition is satisfied by a change in the length of the resonator.

In a further preferred variant of the invention the energy of the pumping radiation is selected in such a way that a difference in energy between an optically pumped quantum well state and the upper or lower laser level corresponds to an integral multiple of the LO phonon energy typical of the material of the quantum well. In this way, the optical pumping pumps charge carriers into excited states whose energy difference relating to the upper or lower laser level corresponds to an integral multiple of the LO phonon energy typical of the material of the quantum well. This has the advantage that the electrons from the excited pumping level pass rapidly to the upper laser level through a resonantly amplified emission of a plurality of phonons. Holes in the valence band can likewise also rapidly pass to the lower laser level when their excitation energy corresponds to an integral multiple of the LO phonon energy.

DETAILED DESCRIPTION OF THE DRAWINGS

Figure 1:
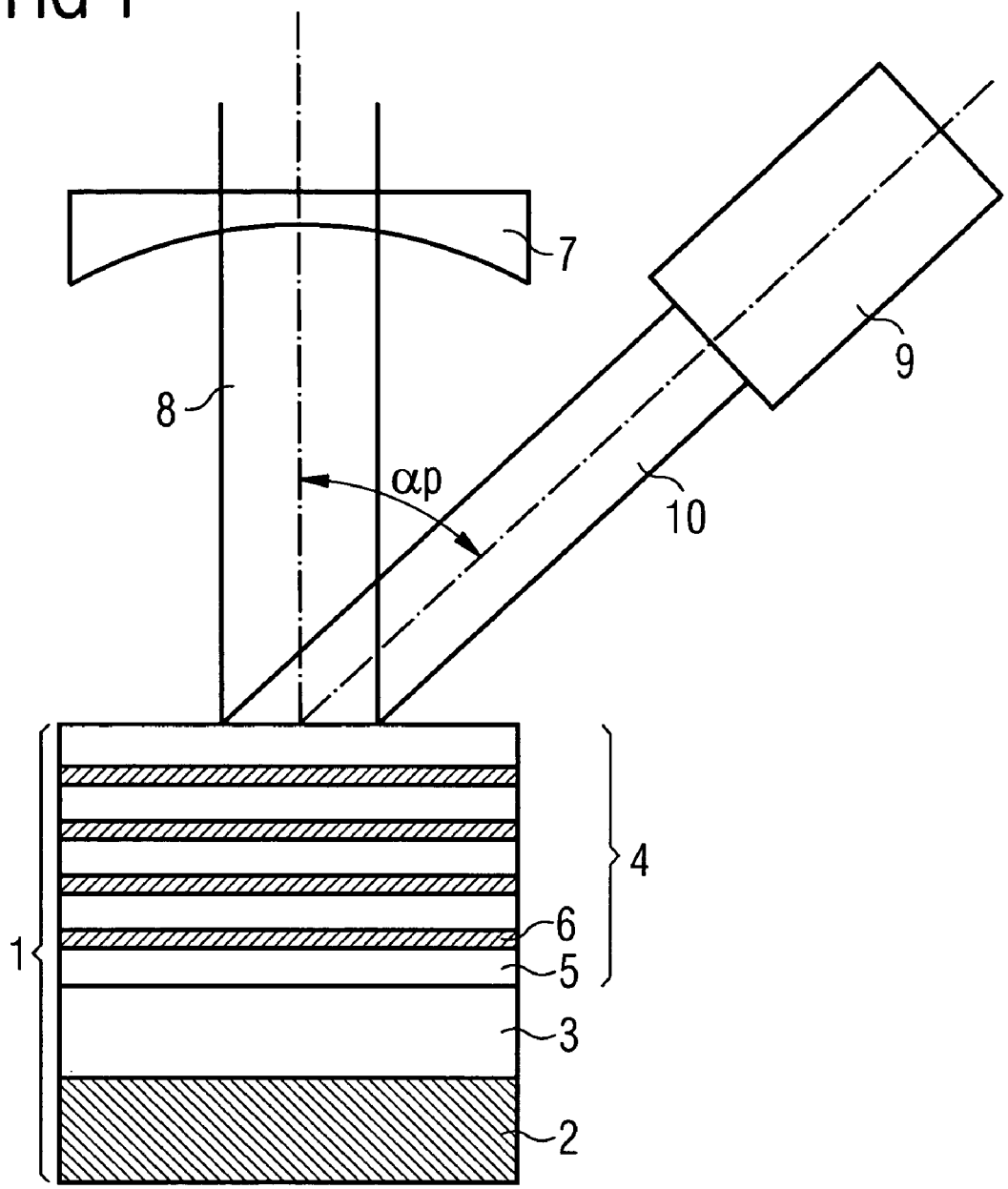
FIG. 1 shows a schematically illustrated design of a vertically emitting semiconductor laser with an external resonator.

FIG. 1 shows a schematic of the design of a vertically emitting semiconductor laser with an external resonator. The laser includes a semiconductor body 1 that includes a reflector 3 on a substrate 2. The reflector 3 is preferably a Bragg reflector. The semiconductor body 1 also includes a quantum well structure 4 as active zone that comprises a plurality of barrier layers 5 and quantum wells 6. The barrier layers 6 can also be a combination of a plurality of layers of different semiconductor materials. Together with an external mirror 7, the reflector 3 forms a resonator for the laser radiation 8. The laser is optically pumped by a pumping radiation source 9 that irradiates pumping radiation 10 with a wavelength $\lambda_p$ into the quantum well structure 4 at an incidence angle $\alpha_p$. The pumping radiation source 9 is preferably a semiconductor laser.

Figure 2:
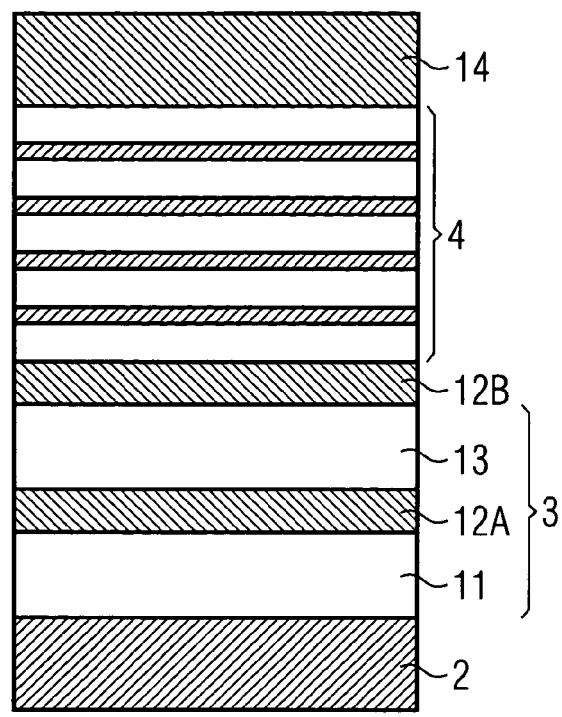
FIG. 2 shows an embodiment of the semiconductor body of a laser according to the invention.

FIG. 2 is a schematic of a preferred embodiment of the semiconductor body of a laser according to the invention. Located on the substrate 2 is a reflector 3 that includes two reflectors 11, 13 arranged one on top of another. The two reflectors are designed such that one of them reflects the pumping radiation, and the other reflects the laser radiation, for example the reflector 11 reflects the pumping radiation, and the reflector 13 reflects the laser radiation. Intermediate layers 12A and/or 12B can be located both between the two mirrors and between one of the mirrors and the active zone. Given a suitable composition and thickness, the effect of the intermediate layers 12A and/or 12B is to produce a standing wave of the pumping radiation with the maxima of the electric field in the quantum wells.

Applied to the surface of the semiconductor body facing the pumping radiation source is a layer sequence 14 that comprises one or more layers and serves for increasing or lowering the reflection of the surface.

Figure 3:
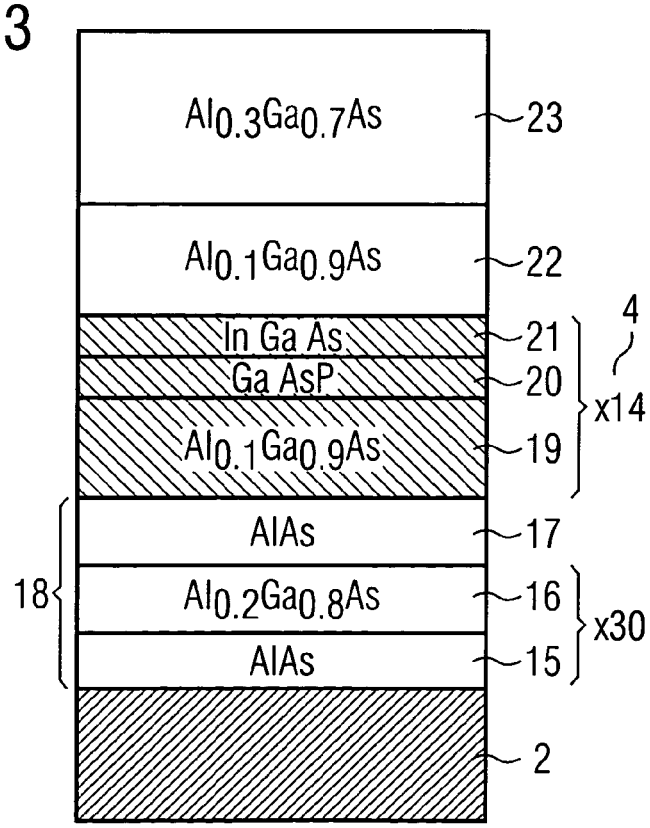
FIG. 3 shows a further embodiment of the semiconductor body of a laser according to the invention.

FIG. 3 shows an exemplary embodiment of a semiconductor body according to the invention. The layer system starts on the substrate 2 with a periodic sequence of in each case thirty approximately 80 nm thick AlAs layers 15 and approximately 70 nm thick $Al_{0.2}Ga_{0.8}As$ layers 16, which is terminated with an approximately 80 nm thick AlAs layer 17. This layer sequence constitutes a Bragg mirror 18. Following the Bragg mirror 18 is a quantum well structure 4 comprising 14 periods. A period of the quantum well structure 4 is assembled from an approximately 110 nm thick $Al_{0.1}Ga_{0.9}As$ barrier layer 19, an approximately 25 nm thick GaAsP barrier layer 20, and the approximately 10 nm thick InGaAs quantum well 21. The use of GaAsP as second barrier layer material serves the purpose of stress compensation. The emission wavelength of this quantum well structure is approximately 985 nm. Applied to the quantum well structure are an approximately 280 nm thick $Al_{0.1}Ga_{0.9}As$ layer 22 and, subsequently, an approximately 430 nm thick $Al_{0.3}Ga_{0.7}As$ layer 23 (or alternatively a GaInP layer). These layers prevent the diffusion of charge carriers out of the active zone.

Figure 4:
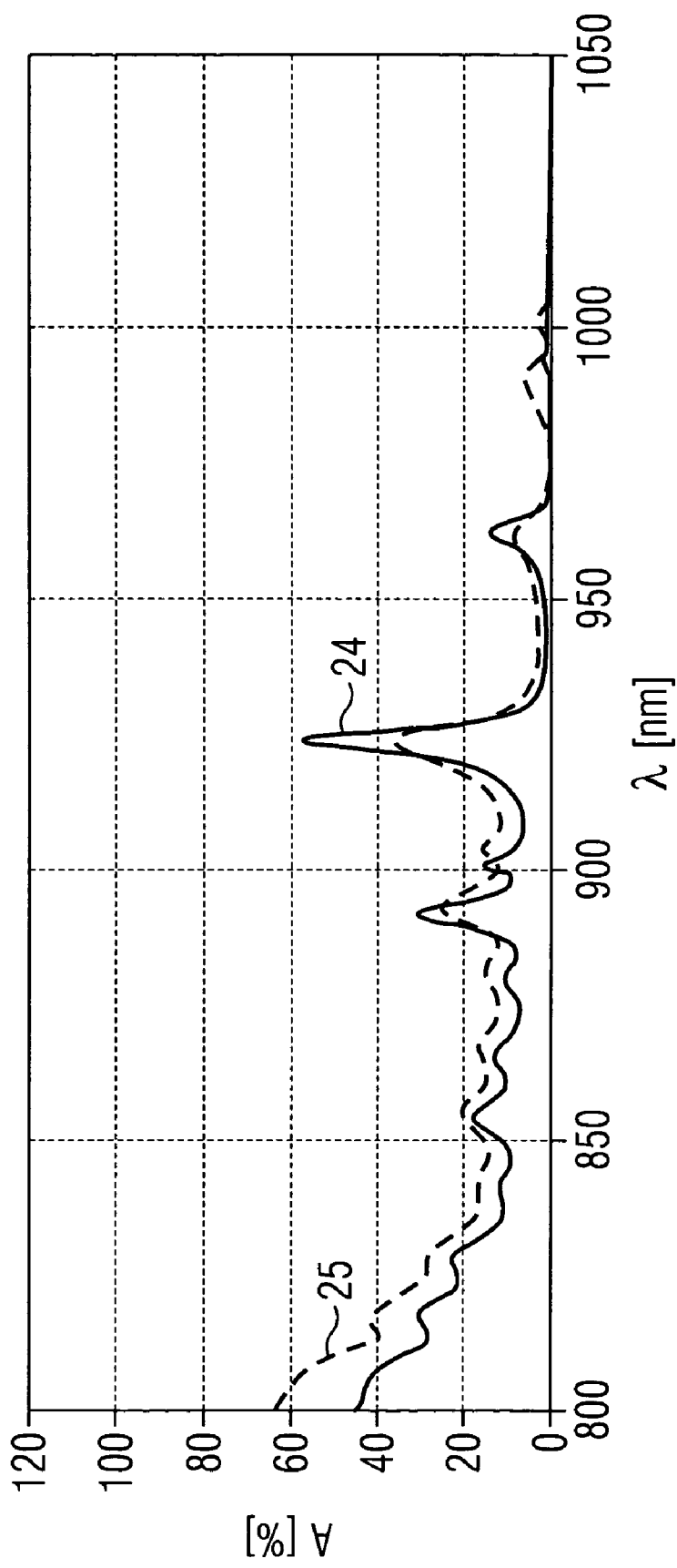
FIG. 4 shows a calculated absorption spectrum of the semiconductor body illustrated in FIG. 3.

FIG. 4 shows a calculated absorption spectrum $A(\lambda)$ of the semiconductor body illustrated in FIG. 3 at an incidence angle of 45° for the s-polarization (continuous line) and the p-polarization (dashed line). The following layer thicknesses were used in this case for the simulation: AlAs layers 15: 82 nm, $Al_{0.2}Ga_{0.8}As$ layers 16: 71 nm, AlAs layer 17: 82 nm, $Al_{0.1}Ga_{0.9}As$ barrier layer 19: 106 nm, GaAsP barrier layer 20: 25 nm, InGaAs quantum well 21: 10 nm, $Al_{0.1}Ga_{0.9}As$ layer 22: 279 nm, $Al_{0.3}Ga_{0.7}$ layer 23: 432 nm. The absorption spectrum illustrated here shows a strong absorption line 24 of the quantum wells 6 that lies at a longer wavelength and therefore, in terms of energy, below the absorption region 25 of the barrier layers, which occurs at approximately 800 nm. The simulation illustrated here by the example of the spectral absorption of the semiconductor body including the quantum well structure 4 serves for finding the optimum incidence angle $\alpha_p$ at which the absorption lines of the quantum wells are most prominent.

Figure 5:
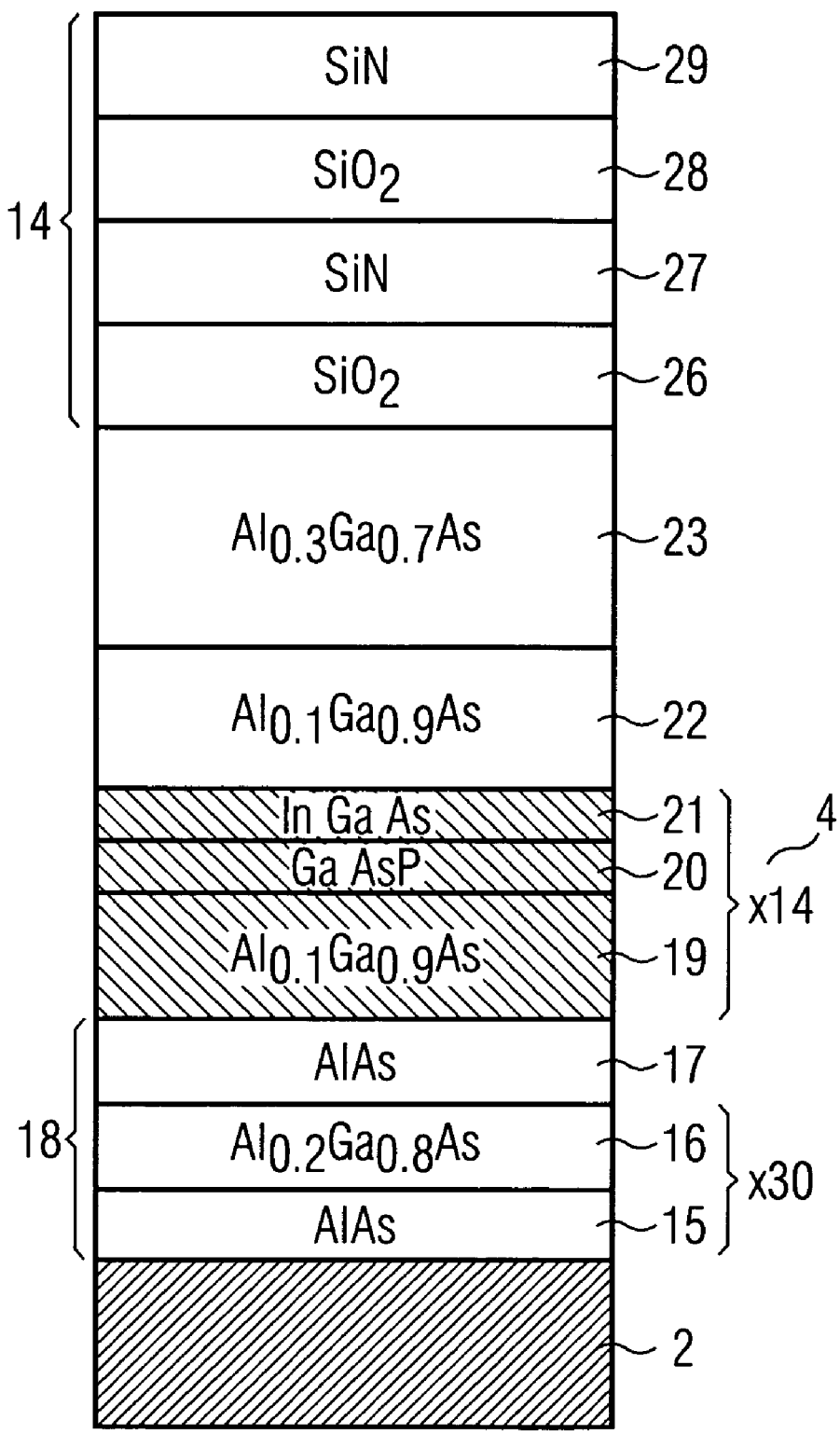
FIG. 5 shows an optimized embodiment of the semiconductor body of a laser according to the invention.

FIG. 5 shows an optimized embodiment of a semiconductor body according to the invention. The semiconductor body differs from that illustrated in FIG. 3 by 4 additionally applied layers. These are an approximately 180 nm thick $SiO_2$ layer 26, an approximately 120 nm thick SiN layer 27, an approximately 180 nm thick $SiO_2$ layer 28 and an approximately 120 nm thick SiN layer 29. This layer sequence 14, applied to the side of the semiconductor body facing the pumping radiation source, increases the reflection for pumping radiation incident from the inner side of the semiconductor body. In cooperation with the reflector 18, these layers effect the formation of a standing wave for the pumping radiation in the quantum well structure for which the maxima of the electric field lie in the quantum wells.

Figure 6:
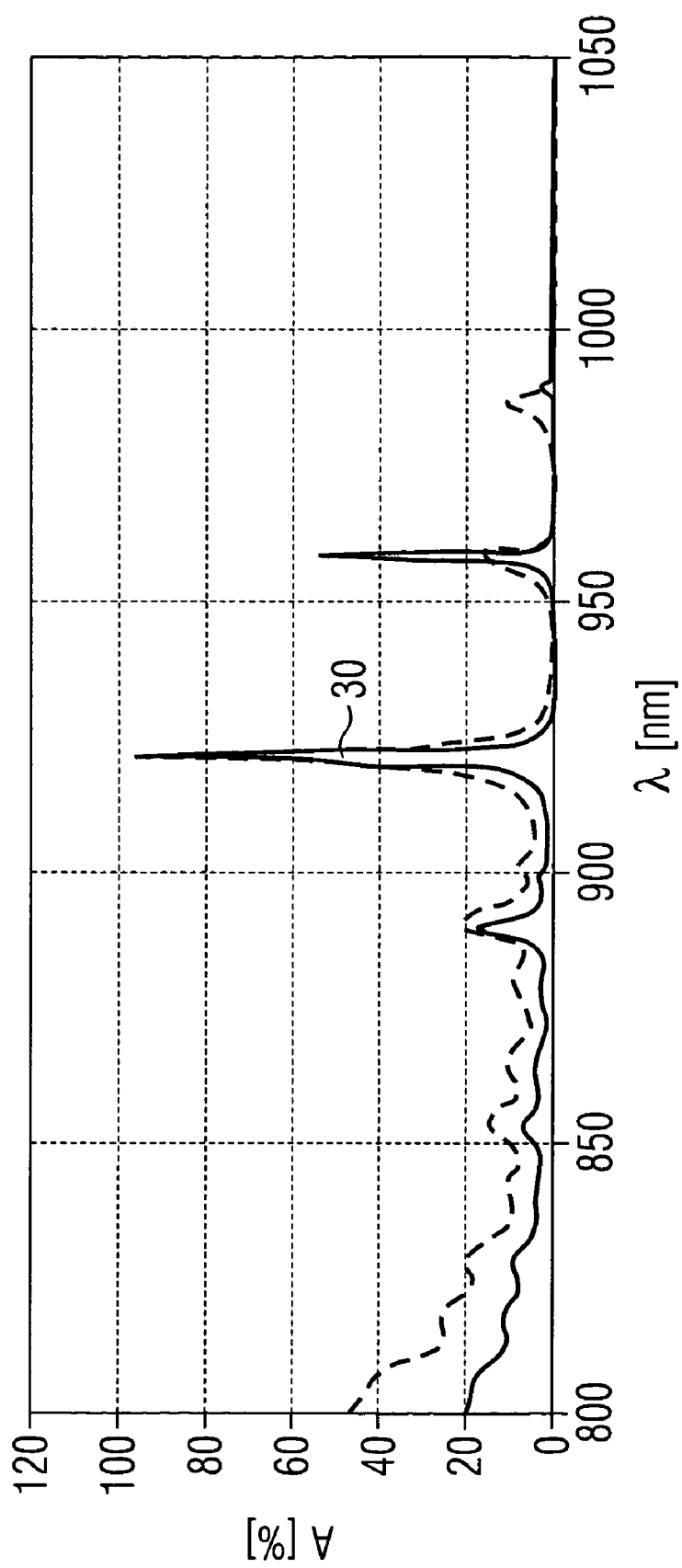
FIG. 6 shows a calculated absorption spectrum of the semiconductor body illustrated in FIG. 5.

FIG. 6 shows a calculated absorption spectrum $A(\lambda)$ of the semiconductor body illustrated in FIG. 5. The following layer thicknesses for the layer sequence 14 were used in this case: $SiO_2$ layer 26: 185 nm, SiN layer 27: 120 nm, $SiO_2$ layer 28: 179 nm and SiN layer 29: 124 nm. All further layer thicknesses correspond to those of the simulation illustrated in FIG. 4. The applied layer sequence 14 effects a resonantly amplified absorption of the pumping radiation 10 in the quantum wells 5 that is to be seen in a pronounced increase in the absorption line 30 at wavelength 925 nm by comparison with the line 24 illustrated in FIG. 3. Radiation of the wavelength of the absorption line 30, which lies at approximately 925 nm, is absorbed up to approximately 100%. The optimum wavelength for pumping the quantum wells 5 lies very much closer to the emission wavelength 985 nm of the laser than in the case of pumping the barrier layers 6 at approximately 800 nm. The energy loss in the pumping process, which occurs owing to the energy difference between the photon energies of the laser radiation 8 and the pumping radiation 10, is thereby greatly reduced.

Figure 7:
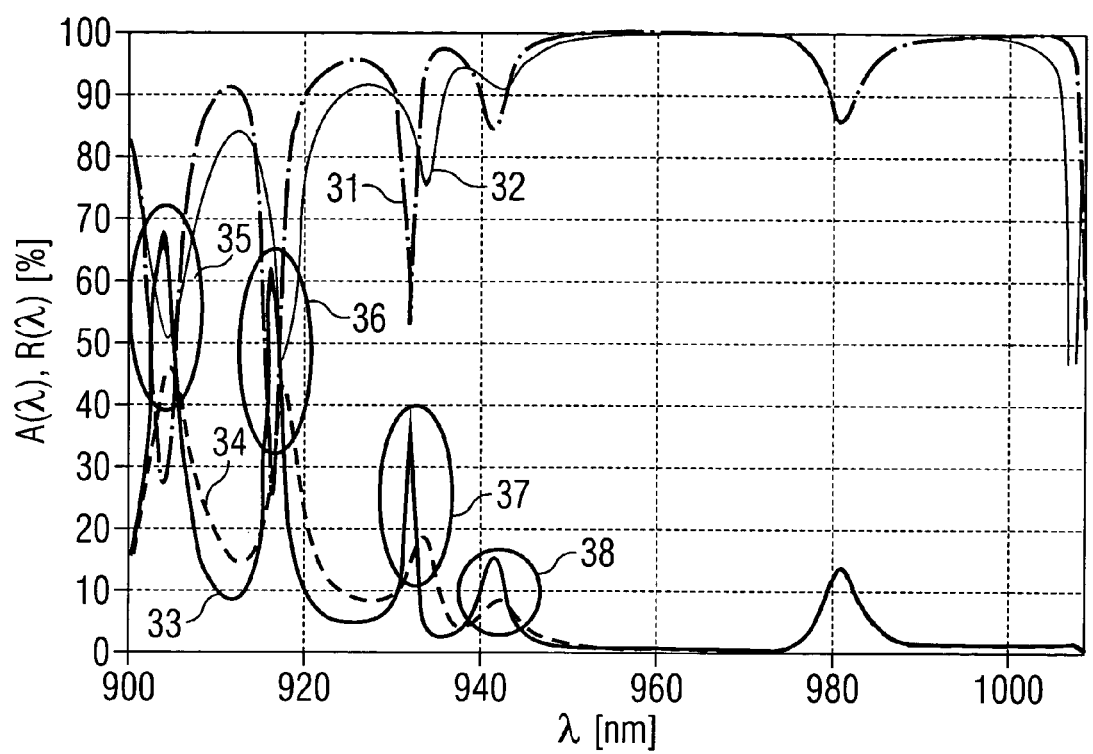
FIG. 7 shows calculated absorption and reflection spectra of a semiconductor body of a laser according to the invention.

Calculated absorption spectra $A(\lambda)$ and reflection spectra $R(\lambda)$ of a semiconductor body of a vertically emitting laser in accordance with the invention are illustrated in FIG. 7. $R(\lambda)$ for the s-polarization is illustrated in curve 31, $R(\lambda)$ for the p-polarization in curve 32, $A(\lambda)$ for the s-polarization in curve 33, and $A(\lambda)$ for the p-polarization in curve 34. The calculations were performed for an incidence angle of 45°. The wavelengths $\lambda$ of the maxima, included in the marked regions 35, 36, 37 and 38, of the absorption spectra are suitable for the irradiation of pumping radiation. At these wavelengths, on the one hand, the absorption of the quantum well structure is high, and, on the other hand, the reflection is advantageously low, such that pumping radiation can be coupled effectively into the semiconductor body.

Figure 8:
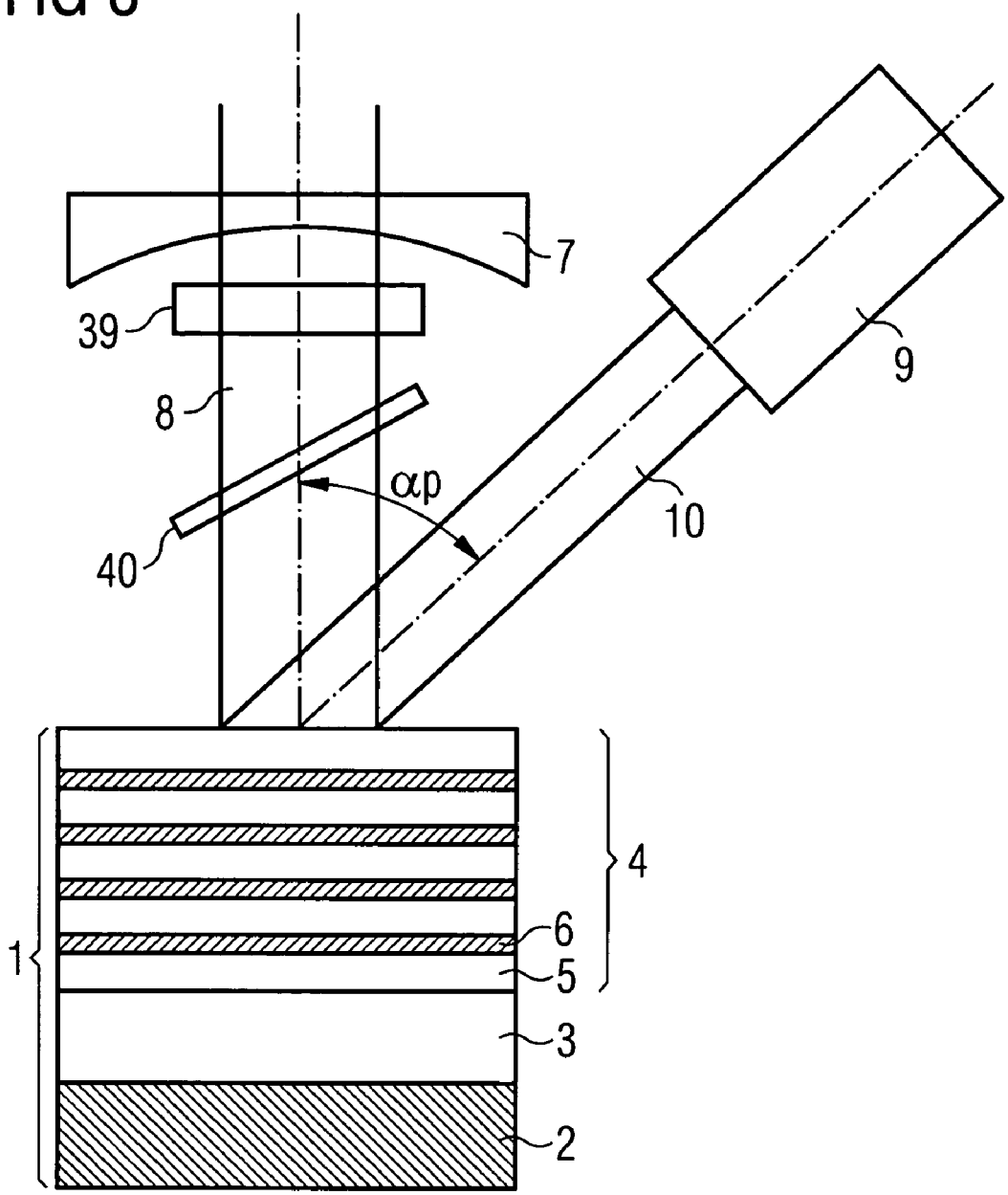
FIG. 8 shows a schematic of an exemplary embodiment of a laser according to the invention.

In the embodiment, illustrated schematically in FIG. 8, of a vertically emitting optically pumped semiconductor laser in accordance with the invention, an optically nonlinear crystal 39 for frequency multiplication of the laser radiation 8, for example for frequency doubling, is included in the external resonator. In order, for example, to effectively generate the second harmonic of the laser radiation, a wavelength-selective element 40 is optionally included in the laser resonator.

The extent to which the invention is protected is not limited by the description of the invention with the aid of the exemplary embodiments. Rather, the invention covers every novel feature and every combination of features, and this includes, in particular, every combination of features in the patent claims, even if this combination is not explicitly specified in the patent claims.

We claim:

1. A vertically emitting semiconductor laser comprising:
   an external resonator;
   a semiconductor body comprising a quantum well structure as an active zone, the quantum well structure comprising a plurality of quantum wells and a plurality of barrier layers respectively situated between adjacent ones of the quantum wells; and
   a pumping radiation source for irradiating into the active zone at an incidence angle $\alpha_p$ pumping radiation of wavelength $\lambda_p$,
   wherein the wavelength $\lambda_p$ and the incidence angle $\alpha_p$ of the pumping radiation are related to each other such that the absorption of the pumping radiation takes place substantially inside the quantum wells, and
   wherein the energy of the pumping radiation is lower than the bandgap of the barrier layers.

2. The laser of claim 1, further comprising a first reflector on the side of the quantum well structure that is averted from the pumping radiation source for reflecting the pumping radiation.

3. The laser of claim 2, wherein the first reflector comprises a layer or a layer sequence.

4. The laser of claim 3, wherein the first reflector is a Bragg reflector.

5. The laser of claim 2, wherein the first reflector is a reflector that reflects both the pumping radiation and laser radiation.

6. The laser of claim 2, further comprising a second reflector for reflecting laser radiation, and an intermediate layer between the first and second reflectors.

7. The laser of claim 2, further comprising an intermediate layer between the first reflector and the quantum well structure.

8. The laser of claim 2, wherein the pumping radiation satisfies the resonance condition of a longitudinal mode of the resonator that is formed from the first reflector and the top side of the semiconductor body.

9. The laser of claim 1, further comprising a layer sequence on the side of the semiconductor body facing the pumping radiation source for increasing the reflection for pumping radiation incident from the inner side of the semiconductor body.

10. The laser of claim 9, wherein the layer sequence has different reflection factors for the pumping radiation and laser radiation.

11. The laser of claim 1, further comprising a layer sequence on the side of the semiconductor body facing the pumping radiation source for lowering the reflection for laser radiation.

12. The laser of claim 1, wherein the incidence angle and the wavelength of the pumping radiation are related to each other such that there occurs inside the semiconductor body a standing wave of the pumping radiation for which antinodes of the electric field are situated inside the quantum well structure in the quantum wells.

13. The laser of claim 1, wherein a difference in energy between an optically pumped quantum well state and the upper or lower laser level corresponds to an integral multiple of the LO phonon energy typical of the material of the quantum wells.

14. The laser of claim 1, further comprising an optically nonlinear crystal in the external resonator for frequency multiplication of laser radiation.

15. The laser of claim 14, wherein the frequency multiplication is a frequency doubling.

16. A vertically emitting semiconductor laser comprising:
an external resonator;
a semiconductor body comprising a quantum confinement structure as an active zone, the quantum confinement structure comprising a plurality of quantum structure layers and a plurality of barrier layers respectively situated between adjacent ones of the quantum structure layers; and
a pumping radiation source for irradiating into the active zone at an incidence angle $\alpha_p$ pumping radiation of wavelength $\lambda_p$,
wherein the wavelength $\lambda_p$ and the incidence angle $\alpha_p$ of the pumping radiation are related to each other such that the absorption of the pumping radiation takes place substantially inside the quantum structure layers, and
wherein the energy of the pumping radiation is lower than the bandgap of the barrier layers.

17. The laser of claim 16, wherein the quantum confinement structure is at least one of a quantum wire structure, a quantum dot structure and a quantum well structure.

18. A vertically emitting semiconductor laser comprising:
an external resonator;
a semiconductor body comprising a quantum well structure as an active zone, the quantum well structure comprising a plurality of quantum wells and a plurality of barrier layers respectively situated between adjacent ones of the quantum wells, the barrier layers having an absorption wavelength; and
a pumping radiation source for irradiating into the active zone at an incidence angle $\alpha_p$ pumping radiation of wavelength $\lambda_p$ so that the active zone generates a laser radiation having an emission wavelength;
wherein the wavelength $\lambda_p$ and the incidence angle $\alpha_p$ of the pumping radiation. are related to each other such that the absorption of the pumping radiation takes place substantially inside the quantum wells, and
wherein the wavelength $\lambda_p$ of the pumping radiation lies between the emission wavelength of the laser radiation and the absorption wavelength of the barrier layers.

* * * * *